(12) United States Patent
Murdock et al.

(10) Patent No.: US 6,525,579 B1
(45) Date of Patent: Feb. 25, 2003

(54) PULSE TRANSLATIONAL CIRCUITS

(75) Inventors: Ben Joseph Murdock, Hyattsville, MD (US); Charles K. Corbett, Bethesda, MD (US)

(73) Assignee: The United States of America as represented by the Attorney General, Washington, DC (US)

( * ) Notice: Subject to any disclaimer, the term of this patent is extended or adjusted under 35 U.S.C. 154(b) by 0 days.

(21) Appl. No.: 03/403,670

(22) Filed: Jan. 12, 1954

(51) Int. Cl.$^7$ .......................... H03K 5/01; H04B 14/04; H04M 1/00
(52) U.S. Cl. ................. 327/165; 375/243; 379/362
(58) Field of Search .................. 250/6.45, 20, 282, 250/20.5 P, 27 PSC, 27 PS, 27 PD, 27 CC; 379/362, 31, 32.01, 387.02, 88.19, 88.2, 133; 307/107; 327/165; 331/144, 145; 375/239, 243, 254

(56) References Cited

U.S. PATENT DOCUMENTS

| | | | | |
|---|---|---|---|---|
| 1,315,539 A | * | 9/1919 | Carson | 327/168 |
| 2,061,734 A | * | 11/1936 | Kell | 375/239 |
| 2,113,214 A | * | 4/1938 | Luck | 375/309 |
| 2,154,492 A | * | 4/1939 | Clough | 331/145 |
| 2,207,511 A | * | 7/1940 | Geiger | 331/144 |
| 2,266,401 A | * | 12/1941 | Reeves | 375/238 |
| 2,343,753 A | * | 3/1944 | Davey | 375/352 |
| 2,402,916 A | * | 6/1946 | Schroeder | 327/282 |
| 2,412,974 A | * | 12/1946 | Deloraine | 375/239 |
| 2,430,547 A | * | 11/1947 | Anderson et al. | 178/70 T |
| 2,545,464 A | * | 3/1951 | Hoeppner et al. | 327/31 |
| 2,648,766 A | * | 8/1953 | Eberhard | 327/26 |
| 2,652,451 A | * | 9/1953 | Feten | 375/337 |
| 2,685,646 A | * | 8/1954 | Ward | 327/165 |

* cited by examiner

*Primary Examiner*—Gregory C. Issing
(74) *Attorney, Agent, or Firm*—Vito J. DiPietro; Carmen Elliot

(57) ABSTRACT

In a circuit for producing output pulses which correspond to pre-selected voltage pulses occurring in an input signal train; means connected to derive from said input signal train a succession of unidirectional pulses, at least some of which pulses occur in time coincidence with the leading and trailing edges of said pre-selected voltage pulses; means including a one-shot multi-vibrator connected to receive said unidirectional pulses and produce a first series of pulses having a uniform duration less than the duration of said pre-selected voltage pulses, means including a bi-stable multi-vibrator connected to receive and produce from said first series of pulses a second series of pulses equal to one half the number of pulses in said first series occurring in a given time interval, and means including a discriminator circuit connected to receive said first and second series of pulses and derive a third series of pulses which corresponds to said pre-selected voltage pulses occurring in said input signal train.

6 Claims, 6 Drawing Sheets

PULSE TRANSLATIONAL CIRCUITS

This invention relates to apparatus for reproducing, from a transmission of pulses a rectangular waves form of pulses as would be produced by the action of opening and closing a pure resistive circuit having a source of constant potential.

In telephone and telegraph circuits, of pure resistance, the action of keying, of lifting and restoring the receiver or hand set, and of dialing, would produce a clean rectangular wave shape. However, such circuits are practically never pure resistance, because the lines have inductance in various forms, such as loading coils, and capacity, such as that between wires of a cable, and between the wires and ground. Therefore instead of obtaining rectangular waves which would be produced in a circuit of pure resistance the opening and closing operation of the actual circuits results in pulses having oscillatory characteristics.

Attempts to record waves produced in the above manner, by ink recorders, from telephone, telegraph, and teletype circuits, may produce a tape which is more or less difficult to read, or may even be completely unintelligible.

In translating transmitted signal pulses as may be encountered in telephone, telegraph and teletype circuits into pulses of rectangular form suitable for such recording, and must first intercept the transmitted signal pulses and pass then through. This differentiates the waves, as will be understood. Then we may pass them through a filter or integrating circuit to remove any undesired components, such as ringing current. Next, we may amplify the resultant as and to the extent desired.

Then, we may pass them through back-to-back rectifiers to convert them to waves always having the same sign. The unidirectional pulses so resulting may then be impressed on the input circuit of a so-called one-shot multivibrator, to produce rectangular waves or pulses, the duration of each pulse so produced being somewhat less than that of a dial pulse at the fastest possible dialing speed as small as the closest possible dialing speed.

Because the multivibrator produces one rectangular pulse for each pulse supplied to its input circuit, and because each dial pulse, when differentiated by line or circuit action, gives rise to two spikes, one positive for the leading edge and one negative for the trailing edge, the multivibrator gives out two rectangular pulses for each dial pulse. The first multivibrator pulse has its leading edge synchronized with the leading edge of the dial pulse or positive spike, and the second multivibrator pulse has its leading edge synchronized with the trailing edge of the dial pulse, or negative spike.

It may be noted at this point that such occurrences as phone pick-up and hang-up also give rise to positive and negative pulses respectively, but the time between them may be very long, compared with the time between the leading and trailing edges of the dial pulses, so that pick-up and hang-up may be regarded as independent events, each producing only one pulse. The trailing edge of the clockwise dialing pulse may be regarded as being synchronous or in coincidence with the leading edge of the first dial pulse, so the clockwise dialing pulse may also be regarded as an independent event, giving rise to only an pulse subsequent to the pick-up pulse, and of the same sign, but of smaller amplitude when differentiated.

From the foregoing, it will be clear that the multi-vibrator produces a rectangular pulse the leading edge of which is synchronous with the leading edge of the pick-up pulse, another rectangular pulse the leading edge of which is synchronous with the leading edge of the clockwise dialing pulse, and two rectangular pulses for each dial pulse, synchronous with the leading and trailing edges thereof, respectively.

These rectangular pulses from the multivibrator may then pass through a differentiation circuit which produces, by differentiation, two spikes of opposite sign for each rectangular pulse. In one embodiment of the invention, a negative spike is synchronous with the leading edge of the pick-up pulse, the leading edge of the clockwise dialing pulse, and with the leading and trailing edges of each dial pulse.

Positive spikes follow each negative spike, at a constant time interval, less than the duration of any pulse to be recorded, but such positive spikes are not synchronous with either leading or trailing edge of any pulse to be recorded, and are not utilized for recording. The negative spikes, on the other hand, are synchronous with the leading edge of the pick-up and clockwise dialing pulses, and with the leading and trailing edge of each dial pulse and may be used eventually to control a pen recorder. For convenience of reference these negative spikes may be called marker spikes, since they mark the beginning and end of each dial pulse. Successive pairs of marker spikes mark dialing pulses and spacing pulses respectively, and they may be readily distinguished, whatever speed of dialing may be involved, because the duration of dialing and spacing pulses is different, whatever the dialing speed, one always being longer than the other.

These spikes may then be supplied to a frequency divider or "flip-flop" circuit, having two conditions of equilibrium, and driven from one to the other by application of a voltage pulse to its control. By adjusting this frequency divider circuit so that it does not respond to the positive spikes, but only to the negative, the frequency divider acts as an on-off switch, changing its state each time it receives a negative spike, and thereby producing a current which flows only during dial pulses, and which can be utilized to operate a relay controlling the pen recorder.

The frequency divider also produces a current which flows during pick-up and clockwise dialing pulses, and which starts synchronously with the leading edge of each, continues for a duration longer than the duration of dial pulses, but is interrupted an appreciable time later, but before the end of the pick-up or clockwise dialing pulse, in a manner to be described. This permits the recorder to show pick-up and clockwise dialing, but prevents the possibility of confusing such pulses with dial pulses.

Because pick-up and clockwise dialing pulses each produce only one negative spike at the frequency divider, as compared to two for each dial pulse, some means must be provided for producing and supplying to the frequency divider a synthetic negative pulse after the negative pulse marking the beginning of the pick-up and clockwise dialing pulses, otherwise the frequency divider will be thrown out of step. This is done by a space return circuit in which a condenser is allowed to charge at a constant rate, and reaches a value which will operate a discharge circuit in a time which is shorter than the shortest pick-up and clockwise dialing pulse, but longer than the longest possible dialing pulse. This discharge generates a negative spike which occurs a predetermined time after the beginning of the pick-up and clockwise dialing pulse and serves synthetically to mark the end, although the end actually has not occurred, and may therefore be said to anticipate the end of said pulses.

An additional circuit may be provided for locking in a circuit activity indicator, responsive to operation of the frequency divider, which may advise the operator that the circuit being monitored is in operation. This indicator may be a lamp, which will remain lighted until the operator actuates a manual reset switch, which he may do when monitoring of the circuit shows that it has ceased operation.

To facilitate monitoring, a separate amplifier with a jack may be operated from the input transformer secondary.

In a modification of the invention, in case it is desired not to record pick-up and clockwise dialing pulses, and talking voltages, which appear before and after the dial pulses, an additional tube and associated apparatus may be connected to the multi-vibrator and frequency divider which suppress all but the dial pulses.

In still another embodiment of the invention, we may employ a circuit which is basically similar to that already described, but differing therefrom in that it is polarized, i.e., the input terminals must be connected to the line in the correct sense.

The features of novelty which we believe to be characteristic of our invention are set forth with particularity in the appended claims. Our invention itself, however, both as to its fundamental principles and as to its particular embodiments will best be understood by reference to the specification and accompanying drawing, wherein we have described our invention, and the manner and process of making and using it, and have set forth the best mode contemplated by us of carrying it out.

As will be understood from the foregoing, a principal object of this invention is to translate transmitted signal pulses of a separate signal circuit into pulses of rectangular wave form suitable for recording.

Another object of this invention is to reproduce pulses of rectangular wave forms, recreated from a separate signal circuit and suppress or eliminate undesired. circuit occurrences.

In order that all of the features of this invention and the mode of operation thereof may be readily understood, a detailed description follows hereinafter with particular reference being made to the drawings, wherein.

Figure 1:
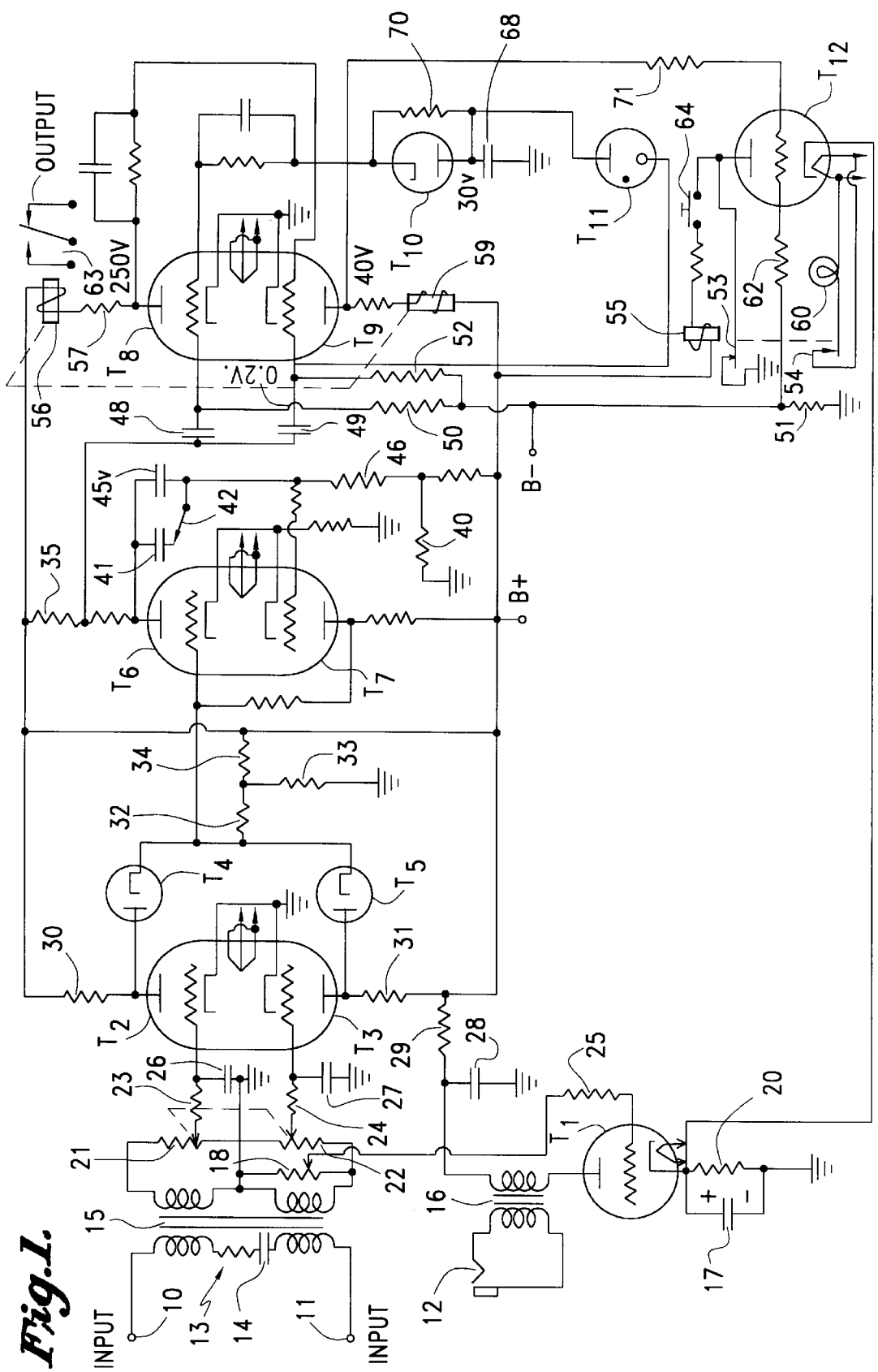
FIG. 1 is a schematic circuit diagram of a first embodiment of the apparatus of this invention having a non-polarized input and which is particularly adapted for telephone dial recording.

The circuit of FIG. 1 comprises a set of input terminals 10 and 11 to which a line transmitting the dial pulses to be recorded can be connected. As will be apparent from the following description, these terminals are non-polarized and, therefore, either side of the line can be connected to either terminal. This circuit will translate any of the forms of signals shown in FIGS. 3a, 3b and 3c when applied to terminals 10 and 11 into a form which, when recorded on a pen register or other device actuated by contact 63, will make apparent to an operator the number dialed.

Figure 2:
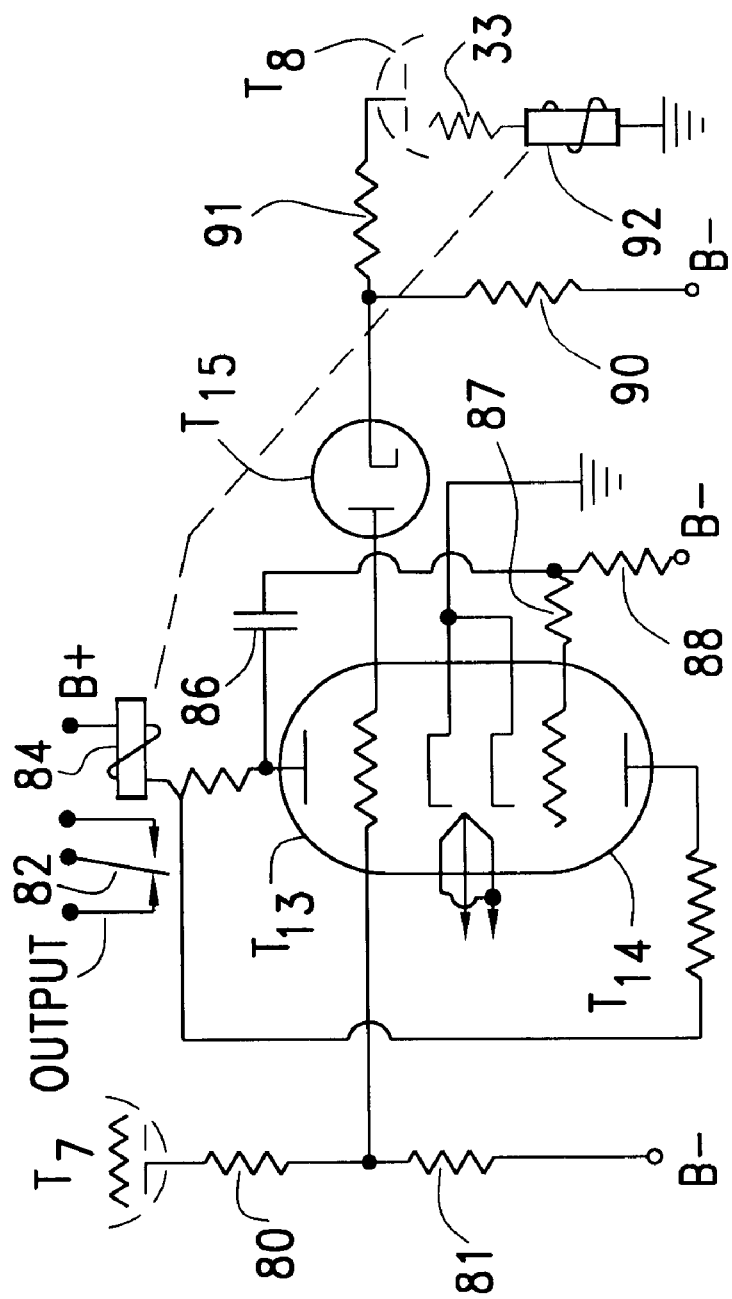
FIG. 2 is a schematic circuit diagram of auxiliary apparatus for connection to the embodiment of FIG. 1 when it is desired to eliminate from the output thereof signals resulting from other than dial pulses.
Figure 3:
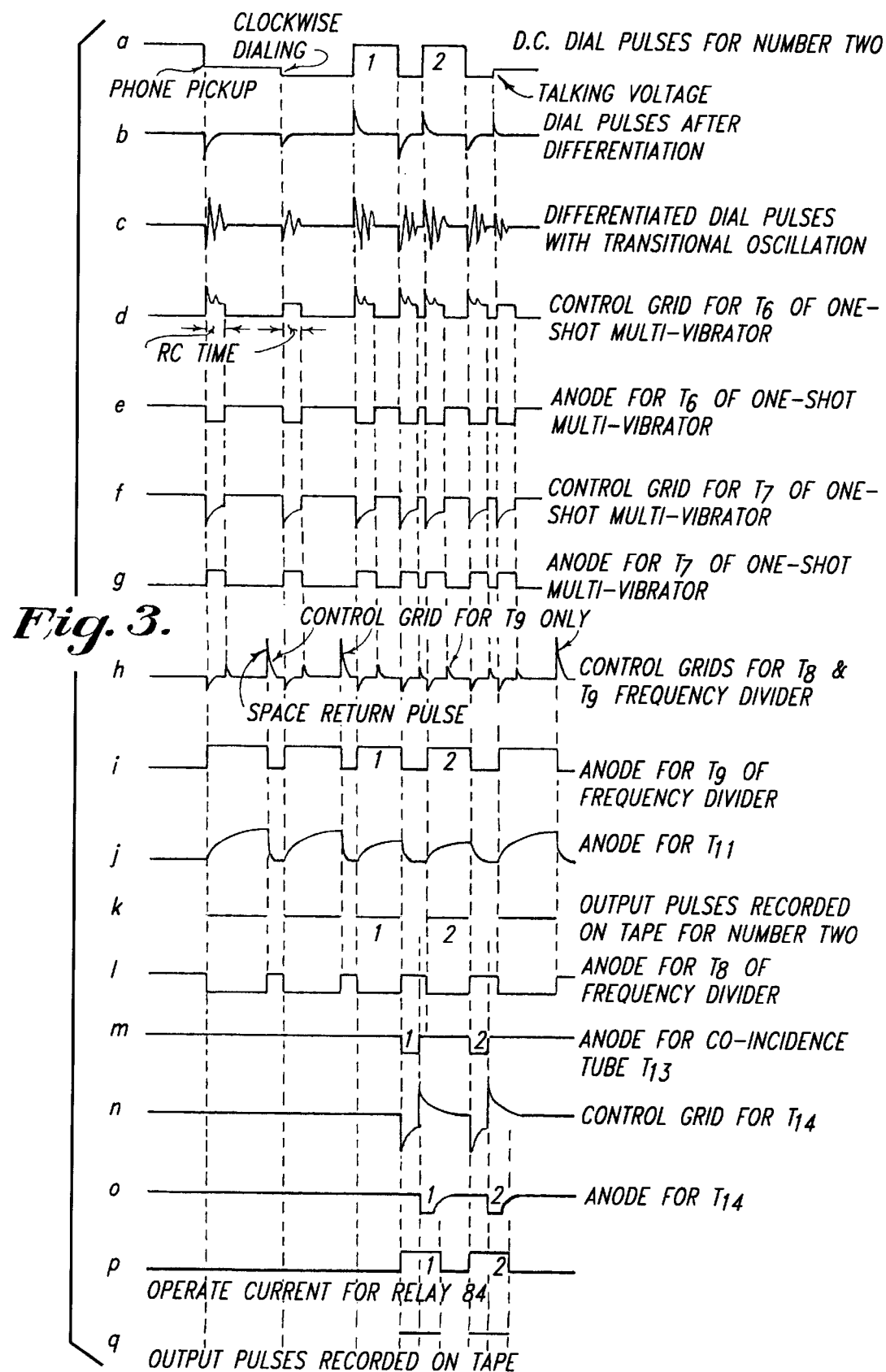
FIG. 3 shows in curves a to l the output and the relative voltages at various points of the circuit embodiment of FIG. 1, and in curves m to q the output and the relative voltages at various points of the auxiliary circuit of FIG. 2.

The curve of FIG. 3a shows a typical D. C. voltage curve of a conventional dial telephone, having a circuit of resistance only, when the number two is dialed. The curve of FIG. 3b shows the differentiated form of the curve of FIG. 3a, such as would appear across the secondary of transformer 15. The curve of FIG. 3c shows the differentiated form of the curve of FIG. 3a with an oscillatory line condition as the result of the presence of repeater coils either locally or remotely in the circuit of the transmitted signal pulses. The curve of FIG. 3 it represents the output of the circuit illustrated in FIG. 1. It will be noted that the two pulses corresponding to the dial pulses are shorter in time interval than the other pulses. These longer or extraneous pulses can be eliminated, if desired, by connecting to the circuit of FIG. 1 the auxiliary circuit of FIG. 2 in a manner described hereinafter. With this mode of operation, the dial pulses 1 and 2 as shown in the wave-train in FIG. 3a comprise pre-selected voltage pulses, with respect to which the inventive circuitry acts to produce corresponding output pulses.

The pulses applied to terminals 10 and 11 are transmitted through the primary windings of transformer 15, through resistor 13 and capacitor 14, which components are utilized to match the impedance presented by input terminals 10 and 11 to the output of the line connected thereto. Each of the split secondary windings of transformer 15 is connected to an individual triode section $T_2$ and $T_3$ of a push-pull amplifier which amplifies the pulses applied to the control grids thereof by the secondary windings of transformer 15. Potentiometers 21 and 22 are individually connected to different secondary windings of transformer 15 with the movable taps of these potentiometers being gauged so that the amplitude of the pulses applied to the control grids for $T_2$ and $T_3$ can be adjusted simultaneously for equal potential. Resistor 23 and capacitor 26, and resistor 24 and capacitor 27 are integrating circuits individually connected to the different control grids for $T_2$ and $T_3$ so as to prevent telephone ringing voltages from actuating the circuitry connected to the output of this amplifier stage and at the same time to damp to some extent the incoming oscillations transmitted over the line connected to input terminals 10 and 11.

The output signal voltage developed by $T_2$ appears across plate load resistor 30 and the output signal voltage developed by $T_3$ appears across plate load resistor 31. These push-pull output voltages are coupled through diodes $T_4$ and $T_5$ to the grid circuit of a one-shot multivibrator comprising triode sections $T_6$ and $T_7$ together with their associated components. Diodes $T_4$ and $T_5$, because of their common cathode or "back-to-back" connection, parallel the output of the individual push-pull amplifier sections and apply it to the input of the one-shot multivibrator. The circuit is non-polarized because the signal applied to the control grid for $T_6$ is the same regardless of the polarity of the line connection to terminals 10 and 11. These diodes also rectify the applied pulses so that only positive alternations appear at the control grid terminal for $T_6$.

During static signal conditions the anodes for diodes $T_4$ and $T_5$ assume a positive potential somewhat less than the multiply-connected cathodes thereof. Accordingly, the amplifier can drive the multivibrator input grid positive but cannot drive it negative from whatever its no-signal resting potential might be, due to the unidirectional coupling characteristics of the diodes. The T-network formed by resistors 32, 33 and 34 reduces the B+ potential appearing at the right terminal of resistor 34 and applied to the multiply-connected cathodes of diodes $T_4$ and $T_5$ to the proper cathode value and at the same time isolates the cathodes of $T_4$ and $T_5$ from the low output impedance of B+ supply.

The one-shot multivibrator comprising tubes $T_6$ and $T_7$ and its associated components is of conventional circuitry.

$T_7$ is the normally conducting section and $T_6$ is the normally non-conducting section. When the control grid of $T_6$ is keyed positively from its normal static potential by applied pulses transmitted through the coupling diodes, the plate circuits of the multivibrator produce square waves as shown in FIGS. 3e and 3g, the duration of which is determined principally by the RC time constant of resistor 46 and capacitor 45, and capacitor 41 when single-pole single-throw switch 42 is closed, and by the bias voltages applied to the control grids for $T_6$ and $T_7$. This time constant is adjustable so as to always have a time duration somewhat less than that of the original dial pulse at the fastest possible dialing speed as well as at the slowest possible dialing speed. Since the original square wave applied to input terminals 10 and 11 was broken up into two oscillations, one corresponding to an open-to-closed line transition and one corresponding to a closed-to-open line transition, the multivibrator will produce two square waves for each pulse and, in addition, one square wave for every line transit or oscillation caused by occurrences such as telephone pick-up, hang-up, clockwise dialing or central office relay activation, as previously explained. The voltage appearing at the control grid for $T_6$ is shown in FIG. 3d and the voltage appearing at the control grid for $T_7$ is shown in FIG. 3f.

In order to convert the square wave multivibrator pulses into a form that will make the identity of the original dialed number clear, the negative driven output of the multivibrator developed across resistor 35 is coupled through a differentiating circuit comprising capacitors 48 and 49 to the control grids of a convention Eccles-Jordan frequency divider formed by triode sections $T_8$ and $T_9$ and their associated components. The Eccles-Jordan divider is a two-state circuit which, when driven by positive and negative pulses of limited amplitude, will alternately change state from one to the other of its resting positions. The coupling circuit between the multivibrator and the frequency divider, comprising capacitor 48 and resistor 50, and capacitor 49 and resistor 52 differentiate the square waves produced by the multivibrator and thus apply one positive and one negative spike to both of the grids of the frequency divider for each square wave, as is shown in FIG. 3h. Since these spikes have a constant amplitude independent of the amplitude of the input signal from the line, and since their amplitude is adjusted so that the positive spikes do not affect the frequency divider, the divider is keyed to its opposite state by each negative transitional spike applied to the control grids thereof. This results in the divider producing one-half the number of square waves produced by the multivibrator. The square waves produced by the frequency divider are of the same time duration and occur in time coincidence with the pulses applied to terminals 10–11 as can be seen from the curves of FIGS. 3i and 3l.

As stated, a comparison of the curve of FIG. 3c with the curve of FIG. 3h will show that there are two negative spikes applied to the control grids of the frequency divider for every dial pulse but only one negative spike for the circuit phenomenon such as phone pick-up, clockwise dialing, talking voltage and hang-up (not shown). This result makes necessary some means for returning the frequency divider to its original state for line conditions which result in only a single negative spike being applied to the control grids of the frequency divider, otherwise the circuit output would be meaningless. Accordingly, a space return circuit is provided to return the divider to its proper state when the divider is triggered in response to line operations which produce only a single negative spikes. The space return circuit in these instances produces an additional negative spike thereby effecting the necessary pair of negative spikes for normal divider operation.

The space return circuit herein provided comprises diode $T_{10}$, shunting resistor 70, capacitor 68, and gas diode $T_{11}$. As is shown in FIG. 1, the upper terminal of capacitor 68 is normally charged during no-signal conditions ($T_{18}$ is normally non-conducting) to approximately 30 volts. The integrating circuit comprising capacitor 68 and resistor 70 is connected to the anode terminal of the normally conducting tube $T_9$ which rests at approximately 40 volts during the no signal conditions. However, when the frequency divider is keyed to the opposite state by a negative pulse, the anode voltage applied to $T_9$ shifts positively to approximately 250 volts and as a result thereof capacitor 68 starts charging positively through resistor 70 at a rate determined by the time constant of the capacitor and resistor. In time coincidence with the voltage change applied to the anode of tube $T_9$, the voltage applied to the control grid of $T_9$ shifts from 0.2 volts positive to approximately 60 volts negative. As capacitor 68 charges, the voltage between the anode of $T_{10}$ and the control grid of $T_9$ reaches the ignition point for gas diode $T_{11}$. When this occurs, capacitor 68 discharges through resistor 52 thereby driving the control grid of $T_9$ sufficiently positive to make $T_9$ conductive. This operation shifts the frequency divider back to its other resting position. As is shown in FIG. 3h the positive spikes applied to the control grid of $T_9$ resulting from the discharge of capacitor 68 have many times the amplitude of the signal spikes applied to the frequency divider by the multivibrator.

As is shown on curves FIGS. 3h and 3j, the time of charging during a normal telephone dial pulse, even at the slowest dialing speed, is of too short a duration to permit capacitor 68 to charge sufficiently to break down gas diode $T_{11}$. However, the time interval between single oscillations, such as telephone pick-up and central office relay activation and clockwise dialing, is sufficiently long to allow gas diode $T_{11}$ to break down. The curves of FIGS. 3i and 3k show the recording of these long pulses as affected by the space return pulses. The long pulses are always the same length regardless of the dialing speed and are, in the usual practical application, at least three times as long as the dial pulse. The limiting factor on their length is the minimum time between the clockwise pulse caused by clockwise dialing and the first oscillation of the actual dial pulse. This time is a minimum when numeral 1 is dialed on the fastest conceivable telephone dial. Even under these extreme conditions there is sufficient time available to allow the time constant of the space return circuit to be approximately three times the length of the dial pulse at the slowest conceivable dialing speed.

Diode $T_{10}$ prevents the successive stairstep accumulation of the charges by capacitor 68 that would otherwise occur as a result of a long succession of applied pulses when a number such as 8 or 9 is dialed. This accumulation occurs because of the physical construction of the dialing mechanism which results in the dial contacts normally remaining open for approximately twice the time they remain closed. This is shown by the curve of FIG. 3a. Therefore, the voltage applied to the anode of $T_9$ is at the 250-volt state twice the time it remains at the 40-volt state. With this condition existing, capacitor 68 is charged during a time twice as long as its discharging time, thereby creating a charge accumulation. With diode $T_{10}$ directly shunting resistor 70, a high impedance is offered during the charge interval and a relatively low impedance is offered during the discharge interval, thereby resulting in a slow charge rate and a very fast discharge rate which more than compensates for the difference between the charge and discharge times for capacitor 68. Windings 56 and 59, connected in the plate circuits for divider tubes $T_8$ and $T_9$, comprise an output polar relay whose transfer contact 63 is used to actuate a pen register or other form of indicating device so that a recording of the general type shown in FIG. 3k may be had.

Tube $T_1$ and its associated components comprise a conventional class A amplifier monitor used for the purpose of monitoring the audio or conversation on the line connected to input terminals 10 and 11. The line signal is developed across volume control potentiometer 18 and is applied through grid resistor 25 to the control grid for $T_1$. Capacitor 17 and its shunting resistor 20 provide conventional cathode bias for $T_1$. The B+ potential applied to the anode of tube $T_1$ through the primary winding of transformer 16 is further filtered by the filter section comprising resistor 29 and capacitor 28. The output of this audio stage appears at terminal jack 12 into which headphones or other audio reproducing means can be plugged.

Tube $T_{12}$ and its associated components including relay 55 comprise a line activity indicator with a manual reset switch 64. This circuit is adjusted so that $T_{12}$ is normally biased to cut off. This negative bias voltage is obtained by the voltage divider formed between the anode of tube $T_9$ and the negative output of the B– terminal and includes serially connected resistors 71 and 62.

Whenever the frequency divider is keyed by applied input pulses to the state opposite its no signal state when the anode for $T_9$, is at its highest potential tube $T_{12}$ is rendered conductive by the positive transition of voltage at the anode of tube $T_9$ assuming reset switch 64 is closed. Relay 55 thereby operates closing normally open contacts 53 and 54. Relay 55 remains operated once energized regardless of whether the grid voltage applied to $T_{12}$ returns to its original value or not. This locking operation is effectuated by the shunting of $T_{12}$ by the closure of normally open contact 53. Normally closed switch 64 connected in the plate circuit for $T_{12}$ functions as a manual reset, and once $T_{12}$ causes relay 55 to operate only the opening of manual reset switch 64 will return the armature for relay 55 and contacts 53 and 54 to their non-operating position. The closure of contact 54 energizes lamp 60.

As will be noted from an inspection of the curve of FIG. 3k, the output record is relatively difficult to read because of the long pulses created by phone pickup, clockwise dialing and the talking voltage which appear before and after the shorter dial pulses. When the auxiliary circuit of FIG. 2 is connected to the proper points of the circuit of FIG. 1, the curve of FIG. 3p can be translated into the curve shown in FIG. 3q. The curve of FIG. 3q shows only output pulses corresponding to the dial pulses. The long and extraneous pulses created by phone pickup, clockwise dialing and the talking voltage are eliminated by the circuit action of the auxiliary apparatus.

In operation, the upper terminal of resistor 80 is connected to the anode of $T_7$, the right terminal of resistor 91 is connected to the anode of $T_8$, and the upper terminal of bias winding 92 for polar relay 84 is connected to the left terminal of resistor 33 after the ground connection for this resistor terminal is broken. The output of the system using the auxiliary apparatus of FIG. 2 appears at contacts 82.

The auxiliary circuit of FIG. 2 is a discriminator circuit which produces the output shown in FIG. 3q whenever coincidence exists in the signal pulses appearing at the anode for $T_7$ and the anode for $T_8$ as shown by the curves of FIGS. 3g and 3l. The anode voltage for $T_7$ is applied to the control grid of $T_{13}$ through resistor 80, and the anode voltage for $T_8$ is applied to the control grid of $T_{13}$ through resistor 91 and diode $T_{15}$. $T_{13}$ is normally biased to cut off by the application of B– to the control grid thereof through resistor 81, and can be made conductive only by an increase in the positive potential appearing on the anode of $T_7$. Any increase in the positive potential at the anode of $T_7$ can make $T_{13}$ conductive only if the anode of $T_8$ is also at its highest positive state. The positive voltage appearing at the anode of $T_8$ cannot key the control grid of $T_{13}$ alone because of diode coupling tube $T_{15}$; however, it can key the control grid of $T_{13}$ negatively if it is already keyed positively by $T_7$ because the plate and coupling circuits of tube $T_8$ have a lower relative impedance than that of $T_7$. $T_{13}$ will, therefore, follow the keying voltage appearing at the anode of $T_7$ as shown by curve of FIG. 3g as long as the voltage appearing at the anode of $T_{15}$ is held sufficiently high by the high voltage state of the anode of $T_8$ as shown by curve FIG. 3-1. Whenever the anode of $T_{15}$ is held sufficiently low by the low voltage state at the anode of $T_8$, $T_7$ cannot key $T_{13}$ because it has a higher impedance plate and coupling circuit as compared to that of tube $T_7$.

In order that the pulse length of $T_{13}$ may be increased, $T_{14}$ is connected in cascade to $T_{13}$ and is driven by $T_{13}$. Relay winding 84 actuating output keying contacts 82 is connected in the circuit in such a manner that the current for both tubes $T_{13}$ and $T_{14}$ flow through its windings resulting in a relay current as is shown in the curve of FIG. 3p the resultant of the curves of FIGS. 3g and 3l

The length of this pulse is adjustable, being made up of two parts one of which is not adjustable since it is determined by the multivibrator pulse length shown in FIG. 3g, and the other of which is adjustable as shown in FIG. 3. The time constants in the grid circuit of $T_{14}$ as determined by capacitor 86 and resistor 88 are readily adjustable, giving a curve of the general shape shown in FIG. 3n. The anode potential for tube $T_{13}$ is showm in FIG. 3m and the anode potential for $T_{14}$ is shown in FIG. 3.

Figure 4:
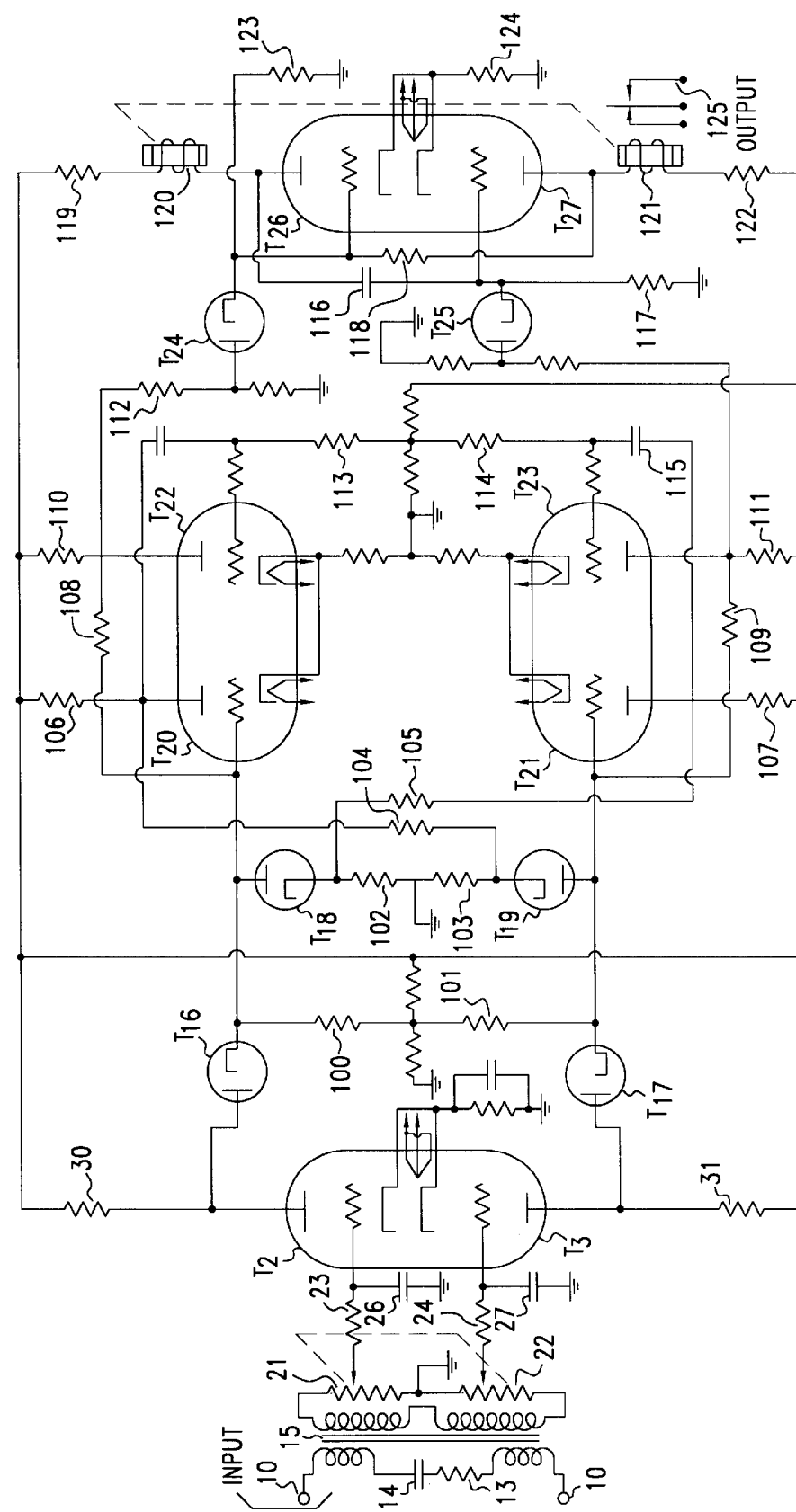
FIG. 4 is a schematic circuit diagram of a second embodiment of the apparatus of this invention having a polarized input.

The circuit of FIG. 4 is in many ways similar to the circuit just described, however, an important difference does exist in that the input is polarized. By this, it is meant that the input terminals are sensitive to the polarity of the incoming line. The initial sense of an input oscillation determines whether the unit will remain in its existing state or be shifted to its opposite state. It is therefore essential that the line be connected to input terminals 10 and 11 in the proper manner. This feature makes the circuit of FIG. 4 ideal for teletype reproduction because the output pulse is of the same sense, the same time duration, and coincident in time with the original pulse. For dial recording, this unit, due to its polarized nature, eliminates the long pulses appearing on the tape as a result of telephone pick-up and clockwise dial rotation.

It is a principal object of the circuit of FIG. 4 to convert a signal having the wave forms shown in the curves of FIGS. 5a, 5b or 5c into a reproduced square wave signal, as shown in the curves of FIGS. 5k and 5l.

The input of the circuit comprises a push-pull class A amplifier and associated components which are identical to those of FIG. 1 of corresponding reference numerals. The amplifier is used to amplify the input pulse or oscillating train. Its push-pull output is coupled through diodes $T_{16}$ and $T_{17}$ to the input control grids for $T_{20}$ and $T_{21}$. $T_{20}$ and $T_{22}$ and their associated components form a first one-shot multivibrator, and $T_{21}$ and $T_{23}$ and their associated components form a second one-shot multi-vibrator. $T_{20}$ and $T_{21}$ normally rest in a no-conduction state because they are biased to cut-off, and $T_{22}$ and $T_{23}$ are at rest in a conducting state.

The diodes $T_{16}$ and $T_{17}$ perform the functions of coupling and rectification. The input grids of the two multivibrators receive only positive pulses from the amplifier stage due to the positive biasing of the cathodes for $T_{16}$ and $T_{17}$ relative to their anodes. The amplifier can drive the multivibrator input grids positive, but cannot drive them negative from whatever their resting potential might be at any instant. The voltages appearing at the input control grids for the two one-shot multivibrators are shown in FIGS. 5e and 5f.

The two multivibrators are of conventional circuitry and when working together form a three-state circuit. Only one of these multivibrators can be keyed at any one time because of the connection of diodes $T_{18}$ and $T_{19}$ across the inputs thereof. On any single incoming oscillation applied to terminals 10 and 11, the first positive alternation received thereby and appearing at the cathode for either $T_{16}$ or $T_{17}$ will key positively the control grid of only the corresponding multivibrator. Let us assume that the first positive alternation appears at the cathode for $T_{17}$, accordingly multivibrator $T_{21}$–$T_{23}$ will be keyed. With this occurrence, the plate voltage at the anode of $T_{21}$ drops and so does the voltage at the cathode of diode $T_{18}$ because it is connected at an intermediate point on the voltage divider comprising resistors 102 and 105 connected between the anode for $T_{21}$ and ground.

When the cathode of $T_{18}$ drops, its anode follows, as does the input control grid for multivibrator $T_{20}$–$T_{22}$.

When the polarity of the first incoming oscillation changes with the second alternation of the first cycle, the input control grid for multivibrator $T_{20}$–$T_{22}$ is driven positive. This grid, however, is not driven as far positively as its original resting potential before the cathode for $T_{18}$ was pulled down by the anode of $T_{21}$.

Multivibrator $T_{20}$–$T_{22}$ cannot be keyed as long as multivibrator $T_{21}$–$T_{23}$ is keyed. Since the circuit of FIG. 4 is a completely symmetrical circuit, the opposite of this is also true, meaning that multivibrator $T_{21}$–$T_{23}$ cannot be keyed as long as multivibrator $T_{20}$–$T_{22}$ is keyed. The plate impedances 30 and 31 for $T_2$ and $T_3$ are considerably lower than the impedance presented by resistors 100, 108 and 110 to $T_{20}$ and resistors 101, 109 and 111 to $T_{21}$ of the multivibrators. This means that the input amplifier could easily shift the multivibrator grid potential from its resting potential were it not that the impedances presented to the control grid of $T_{20}$ by resistors 102, 105 and 107, and the control grid of $T_{21}$ by resistors 103, 104 and 106 are considerably lower than the plate impedances 30 and 31 of the input amplifier sections $T_2$ and $T_3$. In other words, $T_2$ and $T_3$ can only key their corresponding multivibrators when the potential of the cathodes for $T_{18}$ and $T_{19}$ are resting at the higher potential of the two possible states. Consequently, on every incoming oscillation only one multivibrator will be keyed, the one keyed being that to which the first positive alternation of an oscillation train is applied.

Figure 5:
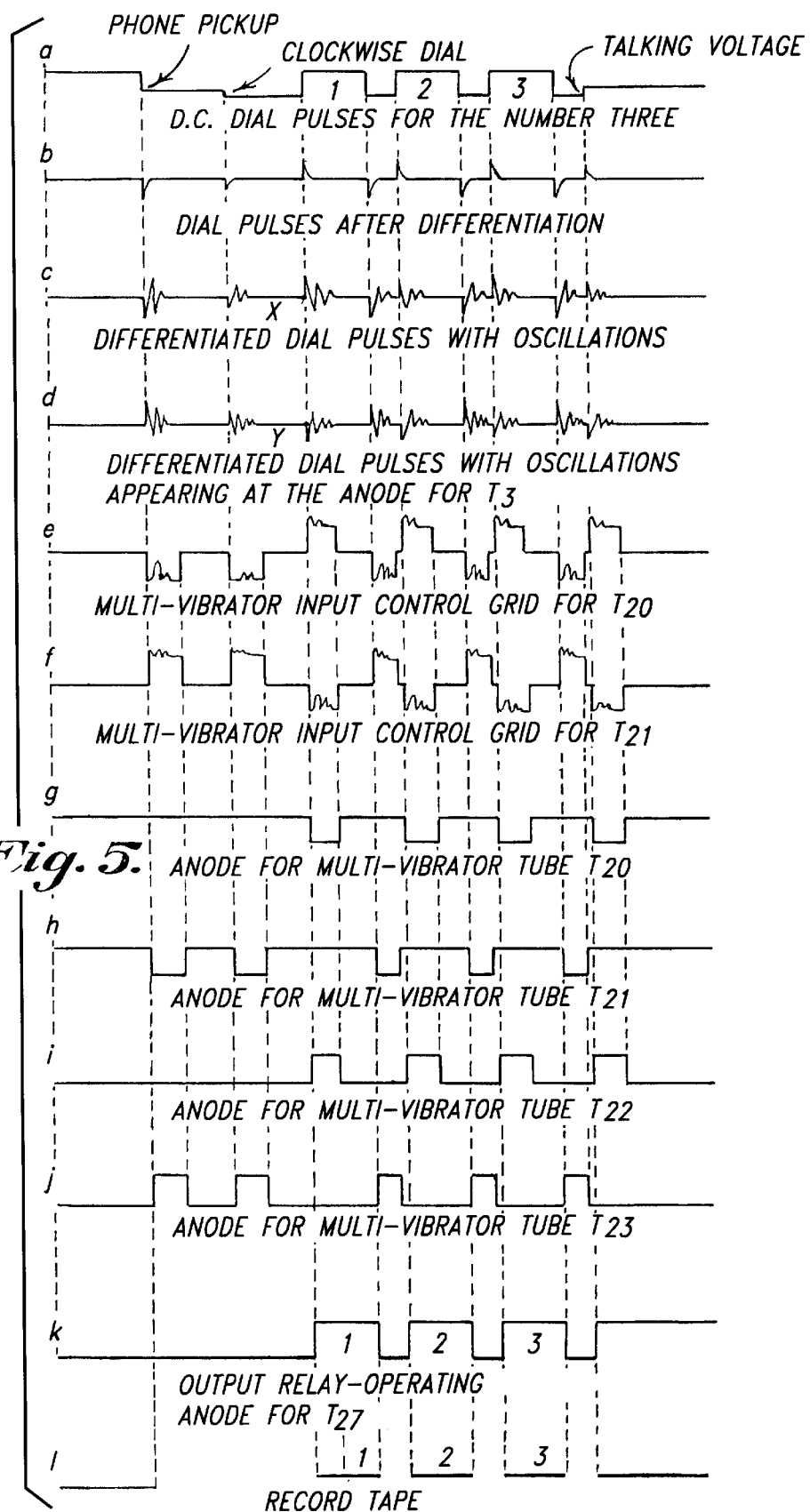
FIG. 5 shows the output and the relative voltages at various points of the circuit embodiment of FIG. 4.

As can be seen from the typical curves shorn in FIG. 5, a square wave after differentiation and after translation of the differentiated spikes into oscillation trains, retains the same polarity in the first alternation of the oscillation as that of the original square wave. Since every square wave is broken up into two oscillations, one corresponding to a rise in line current or potential, and one corresponding to a decay in line current or potential, and since the initial polarity of these two oscillations of a single square wave are 180 20 out of phase with each other, it follows from the above explanation that the original rise in line potential causes one multivibrator to be keyed, and the original decay in line potential causes the second multivibrator to be keyed. This can be seen from the curves of FIGS. 5c, 5d, 5e, 5f, 5g, 5h, 5i, and 5j.

As previously stated, the two one-shot multivibrators are of conventional design with the plate circuits forming square waves of a time duration somewhat shorter than the time duration of a dial pulse at the fastest conceivable dialing speed as small as the slowest possible dialing speed. This time duration is determined by the RC time constant of capacitor 112 and resistor 113, and capacitor 115 and resistor 114 as well as the bias voltage for $T_{22}$ and $T_{23}$.

The output of the two multivibrators developed across resistors 110 and 111 is coupled through diodes $T_{24}$ and $T_{25}$ to the two control grids for $T_{26}$ and $T_{27}$ of a conventional flip-flop circuit. This circuit contains the output relay whose contacts 125 are used to actuate the external registering equipment. This flip-flop circuit has two stable resting states if both grids are directly coupled to the opposite plates. However, in order that this circuit will always eventually return to the same state, the usual resistor in the plate to grid coupling circuit between the anode of $T_{26}$ and the control grid of $T_{27}$ is replaced by capacitor 116. Capacitor 116 and resistor 117 form a relatively long RC time constant which is a number of times longer than the time duration of a single dial pulse.

Diodes $T_{24}$ and $T_{25}$ perform the same general function as diodes $T_{16}$ and $T_{17}$, namely, that of coupling and rectification. The anodes for $T_{22}$ and $T_{23}$ can, through their diodes, shift the potential of the two control grids of the flip-flop circuit in the positive direction only but cannot shift them more negatively than their resting potential. The impedances 110 and 111 of the plate circuits of the multivibrators are considerably lower than the grid circuit impedances presented by 122, 118, 123, and 119, 116, 117, respectively, of the flip-flop, which means that the multivibrator circuits can easily key the flip-flop circuit. A single multivibrator can shift the flip-flop circuit in only one direction. Once it has been shifted in this direction, this multivibrator has no control on the flip-flop at all because its output is coupled through a diode whose cathode is held at the higher voltage of its two resting states. It is clear from drawing of FIGS. 5a, 5k, and 5l that the flip-flop circuit divides the sum of the two multivibrator square wave pulses by the factor of two, thereby restoring the original square wave.

As was mentioned above, the time constant of capacitor 116 and resistor 117 is very long in comparison to the time duration of a single dial pulse. It is the purpose of this circuit to eventually return the flip-flop circuit to its original resting state but at the same time have the time constant long enough so as not to interfere with nominal dialing or the normal length square waves such as five marks and a stop pulse of the teletype code. This space return places a terminating time on the duration of the long pulse placed at the end of a dialing sequence caused by the actuation of talking battery or telephone hang-up. Of course, in the use of teletype this circuit never comes into play except in the event the line is opened up for a long period of time in which case this circuit would prevent the teleprinter from running open for a period of rather long-time duration.

Figure 6:
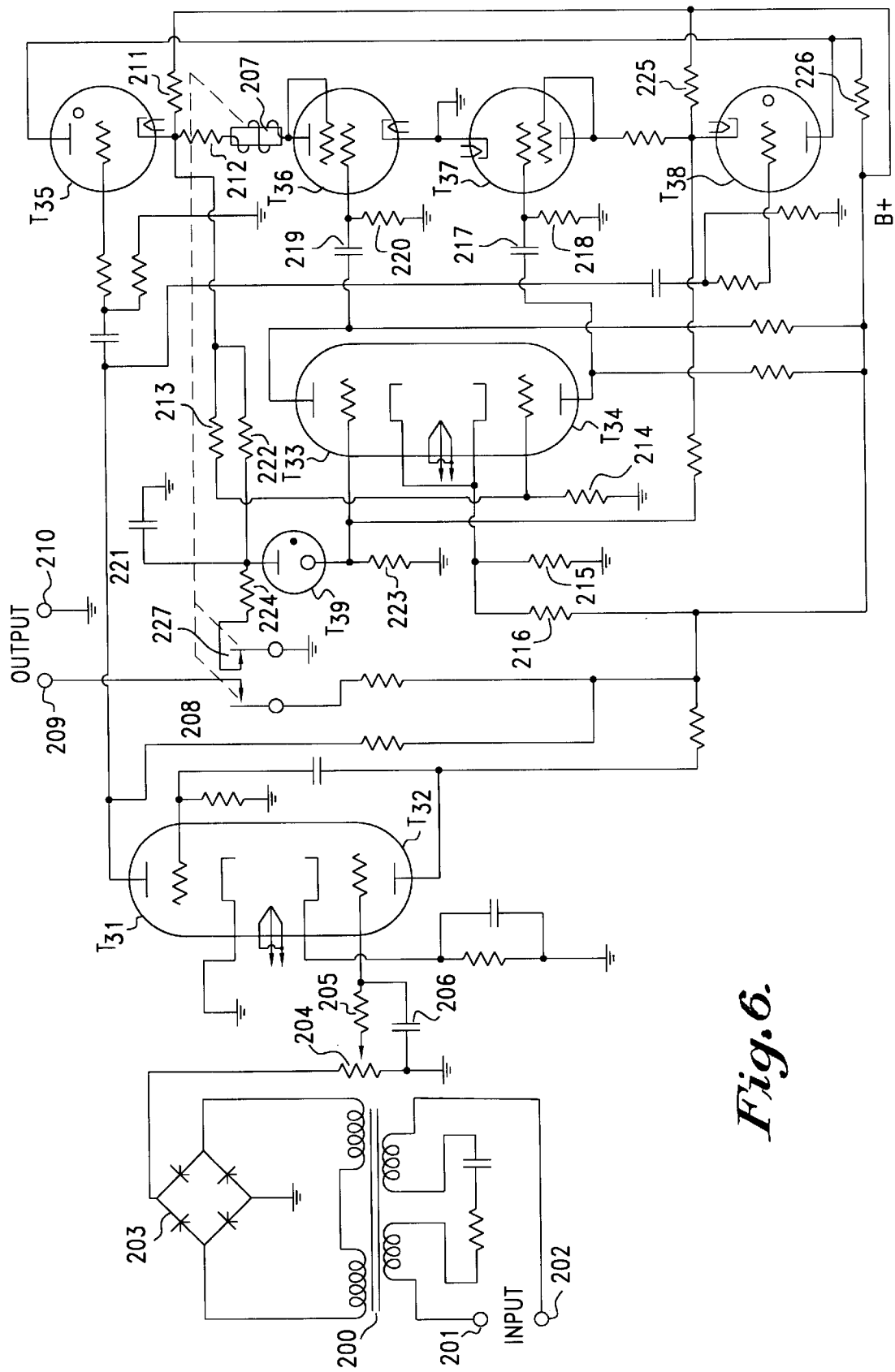
FIG. 6 is a schematic circuit diagram of a third embodiment of the apparatus of this invention having a non-polarized input.

The circuit of FIG. 6 is a non-polarized device, the polarity of the line having no effect upon the unit. From an operational stand-point, it operates in substantially the same manner as the single multivibrator frequency divider shown in FIG. 1. The curves of FIGS. 3a, 3b, 3c, 3i, 3j and 3k are descriptive of this circuit. However, the legends associated with these curves do not apply to this circuit. It is the purpose of this invention to change a wave in the form of any of the curves of FIGS. 3a, 3b and 3c to that shown in the curves for FIGS. 3i and 3k.

The circuit comprises an input transformer 200 whose primary is connected to the line at terminals 201 and 202 and whose secondary is coupled to a full-wave, bridge-type rectifier 203. The rectified output of transformer 200 is coupled to the control grid of T32 the input to two cascade coupled class A amplifier stages comprising T31 and T32. Resistor 205 and capacitor 206, together with the lower tapped portion of potentiometer 205, form an integrating network used to prevent telephone ringing voltage from activating the frequency divider and at the same time damp the incoming oscillations to some extent. The output of the two-stage amplifier appears at the anode of T31 and is coupled to the control grids of thyratrons T35 and T38.

T33, T34, T35, T36, T37 and T38 cooperate to form a frequency divider which operates in the following manner.

T36 and T37 and their associated components are igniter stages located in the cathode circuits for T35 and T38, respectively, and as such control the amount of conduction current flowing in thyratrons T35 and T38. Output relay 207 is located in the cathode circuit for T35, with the relay-operating current being principally the anode to cathode current for T35. The closure output 208 activates external recorder or registering equipment connected to output terminals 209 and 210.

In the static or no-signal condition, one of thyratrons T35 and T38 is in a fired condition and one is in an unfired condition. Let it be assumed that T35 is unfired and T38 is fired. In this condition, igniter tube T36 is conductive since its grid-cathode voltage is zero. Resistor 211, resistor 212, relay winding 207, and T36 form a voltage divider between B+ and ground which establishes the no-signal positive potential for the cathode of T35. This circuit is adjusted such that the positive potential for the cathode of T35 provides sufficient bias to prevent T35 from firing. The cathode of T35 is at the lower potential of its two possible states and since the control grid of T34 is coupled potentialwise through a voltage divider formed from series connected resistors 213 and 214 to the control grid of T34, this control grid is also in the lower of its two states. In this lower state, T34 is cut off since the cathode potential T33 and T34 is held at a sufficiently high positive potential by the voltage divider formed from serially-connected resistors 215 and 216 to cut off T33 or T34 when the corresponding control grid is in the lower of its two resting states. Also with this bias so adjusted T33 and T34 are in the conducting state when their controlling thyratron is fired. With T35 unfired and T38 fired, as assumed, T34 is non-conducting and T33 is conducting.

Now consider an oscillating train applied to line terminal 201 and 202 under this assumed condition. It is rectified and amplified and due to the rectification and phasing of the amplifier a positive pulse is applied to the control grids for thyratrons T35 and T38. Since T38 is already fired, its grid has no control. However, the positive spike applied to the control grid for T35 causes T35 to fire. When this occurs, the high resistance of resistor 211 is shunted by the low resistance of 226 in series with the low anode impedance of the conducting T35. This causes a very large increase in the cathode current of T35. As a result of this increase in current the positive potential at the cathode of T35 rises sharply by the increase in the voltage drop across resistor 212, the relay 207 and T36. This causes the control grid of tube T34 to be shifted positively to cause tube conduction and its plate potential to be shifted sharply negative and held there due to the coupling between the cathode of T35 and the control grid of T34 through resistor 213. This causes a very strong negative spike with an exponential time return determined by resistor 218 and capacitor 217 to be applied to the control grid of igniter tube T37 controlling thyratron T38. This negative grid spike causes the impedance of T37 to be shifted to a very high value affecting cut-off conditions. In this condition the cathode of T38 is shifted to nearly full B+ potential due to there being almost no flow of current through resistor 225 and T37. With the cathode of T38 near B+ potential, the anode of T38 is at a potential lower than B+ due to the voltage drop across resistor 226 caused by the plate current of T35. This constitutes a negative anode to cathode voltage across T38 which causes de-ionization of the thyratron.

When T38 is unfired, the potential on its cathode rises to nearly full B+ potential, and consequently the grid of T33 rises and produces a small negative voltage spike at the grid of T36. This negative spike is of such small magnitude that the conductivity of T36 and T35 is unaffected. As capacitor 217 discharges through resistor 218, tube T37 again becomes conductive and the resulting current flow through the relatively high impedance of resistor 225 causes a large negative shift of potential at the cathode of T38. Consequently, the grid of T33 is shifted negatively and is held there until the next positive signal pulse fires thyratron T38. This negative shift of potential at the grid of T33 produces a strong positive voltage spike at the grid of T36; however, this positive spike is ineffective since T36 is already in a fully conducting state.

Now, immediately after T35 has been fired, the successive oscillations of the first oscillating train have no effect upon T35 since its grid has no control in the fired condition. The successive oscillations of this train cannot fire T38 because its keyer tube is held non-conductive for a period determined by the time constant of capacitor 217 and resistor 218. By the end of this time the oscillation has damped itself out. The time constant of capacitor 217 and resistor 218, and capacitor 219 and resistor 220 is a little shorter than a dial pulse at the fastest conceivable dialing speed.

Since this is a completely symmetrical circuit, it follows that the unfiring of one thyratron is a function of the firing of the other and when one thyratron is fired, the other one cannot be fired until capacitor 217 and resistor 218 or capacitor 219 and resistor 220 time has elapsed. The unit rests always with one thyratron fired and any oscillation regardless of original polarity will fire the unfired thyratron which in turn causes the fired thyratron to be unfired.

Since each original square wave is broken up into two oscillations, it follows that this frequency divider will divide the total number of incoming oscillations by a factor of two, thus reproducing the original square wave.

The space return circuit associated with this unit is used for the purpose of assuring that the frequency divider always rests in the proper resting state. This resting state exists when T38 is fired. In this condition, capacitor 221 is charged to the voltage on the cathode of T35 which is not high enough to cause the neon bulb T39 to ignite. Whenever the frequency divider is keyed to the opposite from its resting state, the voltage on cathode of T35 is shifted to its higher voltage state and consequently capacitor 221 will be charged through resistor 222 at a rate determined by the constant of resistor 222 and capacitor 221. Whenever the potential across capacitor 221 due to its increasing charge reaches the ignition voltage of the neon bulb, the neon bulb will ignite and capacitor 221 will be discharged through the neon bulb and resistor 223. This causes a sharp positive spike to appear on the grid of T33 which results in a sharp negative spike on the grid of igniter T36. This causes thyratron T35 to be unfired thus reducing to zero the current through resistor 226, and causes full B+ potential to be applied to the anode of T38 which results in the firing of thyratron T38.

Resistor 224 and the normally closed contact 227 actuated by relay 207 prevent a stairstep accumulation of charge in capacitor 221 as the result of a long succession of pulses which would result if a number like 8 or 9 were dialed. This accumulation of charge exists due to the physical construction of the dialing mechanism. The dialing cam of a telephone instrument is designed so that the line is open for approximately twice the time it is closed. This results in thyratron T35 remaining in the fired condition approximately twice the time it remains in the unfired condition, causing the charge time of capacitor 221 to be approximately twice its discharge time, resulting in this stairstep charge accumulation. With resistor 224 and the normally closed contact of the relay connected as shown, capacitor 221 is charged through a very high resistance 222, but is discharged through a relatively lower resistance 224. The effect of this is that of giving capacitor 221 a very slow charge rate and a very fast discharge rate which more than compensates for the differential charge discharge time.

The time constant for resistor 223 and capacitor 221 is made long enough so as not to interfere with normal dialing, but is made short enough so that when the number 1 is dialed at the fastest conceivable dialing speed and the clockwise pulse fires T35, the space return circuit will cause T35 to be unfired before the number 1 pulse is recorded. In actual practice, this time can be about three times the length of a dial pulse at the slowest conceivable dialing speed.

While we have shown and described certain embodiments of our invention in the foregoing, it should be clear that modifications and changes may be made, as will be apparent to those killed in the art, without departing from the spirit and scope of our invention.

What is claimed is:

1. In a circuit for producing output pulses which correspond to pre-selected voltage pulses occurring in an input signal train; means connected to derive from said input signal train a succession of unidirectional pulses, at least some of which pulses occur in time coincidence with the leading and trailing edges of said pre-selected voltage pulses; means including a one-shot multi-vibrator connected to receive said unidirectional pulses and produce a first series of pulses having a uniform duration less than the duration of said pre-selected voltage pulses, means including a bi-stable multi-vibrator connected to receive and produce from said first series of pulses a second series of pulses equal to one half the number of pulses in said first series occurring in a given time interval, and means including a discriminator circuit connected to receive said first and second series of pulses and derive a third series of pulses which corresponds to said pre-selected voltage pulses occurring in said input signal train.

2. In a circuit for producing output pulses which correspond to pre-selected voltage pulses occurring in a signal train of input pulses; means connected to receive said train of input pulses, means including push-pull amplifier means and diode means connected to convert said received input pulses to the same polarity, a multi-vibrator having a single stable mode of operation and connected to derive from said pulses of same polarity a series of output pulses each having a pulse width which is less than the pulse width of said pre-selected voltage pulses, differentiating means connected to receive the series of output pulses derived by said multi-vibrator; a flip-flop circuit provided with a pair of tubes, and having first and second stable modes of operation, connected to said last mentioned means to receive a differentiated signal therefrom; and separate means including an R-C integrating circuit connected to sample the output voltage of one of said tubes for re-setting said flip-flop circuit to said first mode when said flip-flop has switched modes in response to a pulse which does not correspond to the leading or trailing edge of one of said pre-selected pulses.

3. A circuit as set forth in claim 2, including means connected to said multivibrator and to said flip-flop circuit, and responsive to the jointly applied outputs therefrom for producing a series of pulses which correspond to said pre-selected voltage pulses occurring in said input signal train.

4. In a circuit for producing output pulses which correspond to pre-selected voltage pulses occurring in a signal train of input pulses, transformer means for receiving and differentiating said train of input pulses, a full wave rectifier for rectifying the individual alternations in the differentiated input pulses into a succession of pulses having the same polarity; an amplifier including at least one tube with anode, cathode, and control grid, for amplifying said succession of pulses; a pair of gas tubes, each provided with at least anode, cathode and control grid electrodes, and each having the control grid electrode thereof connected to said anode of said tube; two igniter tubes, each connected in the cathode circuit of one or said gas tubes respectively; a pair of triodes each having an anode connected to the control grid of one of said igniter tubes respectively, and a cathode tied in common to a control grid of the said amplifier, and an output signal producing means from which an output wave-form may be obtained connected to sample the current of one of said gas tubes.

5. In a circuit for producing output pulses which correspond to pre-selected pulses of constant pulse-width occurring in an input signal train; means for differentiating all of the voltage pulses in said input signal train, including said pre-selected voltage pulses of constant pulse-width; means for producing a square wave pulse having a leading edge coincident in time with each leading or trailing edge of each voltage pulse occurring in said input signal train, each of said square waves pulses having a pulse-width less than the constant pulse-width of said pre-selected voltage pulses; means including a flip-flop circuit provided with a pair of tubes for producing output pulses from said square wave pulses which correspond to said pre-selected voltage pulses; means connected to sample the output voltage of one of said tubes for producing a pulse for re-setting said last mentioned means, when said means has switched modes in response to a pulse in said input signal train which does not correspond to the leading or trailing edge of one said pre-selected pulses; and output signal producing means for rendering said output pulses available for recording.

6. In a circuit for producing output pulses which correspond to pre-selected voltage pulses occurring in a signal train of input pulses, transformer means for differentiating said input pulses, an integrating circuit connected to the secondary of said transformer means to attenuate oscillations in the differentiated voltage pulses; push-pull amplifier means including tubes provided with anode, cathode, and control grids; a pair of rectifiers with common cathode connections, said control grids of said push-pull amplifier means being connected to receive said differentiated voltage pulses from said integrating circuit, said rectifiers being connected to the anodes of said push-pull amplifier means to convert the outputs thereof to signal pulses of like polarity; a one-shot multi-vibrator having a pair of control grids connected to said commona cathode connection between said rectifiers, and connected to produce outputs wave-forms having a pulse-width less the pulse-width of said pre-selected voltage pulses; a flip-flop circuit having two stable operational modes, said flip-flop circuit including a pair of control grids connected to the output electrode of said multi-vibrator; and means for re-setting said flip-flop circuit comprising a diode, a capacitive timing element and a normally non-conductive gas tube, the anode of the said diode being connected to one control grid of said flip-flop circuit and the cathode of said gas tube being connected to the other control grid of flip-flop circuit, said capacitive timing element being inter-connected between said diode and the said gas tube.

* * * * *

UNITED STATES PATENT AND TRADEMARK OFFICE
CERTIFICATE OF CORRECTION

PATENT NO.  : 6,525,579 B1
DATED       : February 25, 2003
INVENTOR(S) : Murdock et al.

It is certified that error appears in the above-identified patent and that said Letters Patent is hereby corrected as shown below:

Title page,
Item [74], *Attorney, Agent, or Firm*, cancel "Carmen" and insert -- Cameron --

Column 1,
Line 4, cancel "waves" and insert -- wave --
Line 24, cancel "and" (first occurrence) and insert -- wave --
Line 25, cancel "then" and insert -- them --
Line 35, cancel "small" and insert -- well --

Column 2,
Line 15, insert a comma after "pulse"

Column 4,
Line 7, cancel "FIG 3 it" and insert -- FIG 3*k* --

Column 7,
Line 29, delete comma after "$T_9$" and insert comma after "potential"
Line 66, insert -- respectively -- after "3*l*"

Column 8,
Line 26, insert comma after "3*p*"
Line 27, insert period after "3*l*"

Column 9,
Line 62, cancel "18020" and insert -- 180º --

Signed and Sealed this

Sixth Day of January, 2004

JAMES E. ROGAN
*Director of the United States Patent and Trademark Office*